United States Patent [19]

Brunsvold et al.

[11] Patent Number: 5,023,164

[45] Date of Patent: Jun. 11, 1991

[54] HIGHLY SENSITIVE DRY DEVELOPABLE DEEP UV PHOTORESIST

[75] Inventors: William R. Brunsvold, Poughkeepsie, N.Y.; Philip Chiu, Edison, N.J.; Willard E. Conley, Jr., Cornwall, N.Y.; Dale M. Crockatt, Somers, N.Y.; Melvin W. Montgomery, New Windsor, N.Y.; Wayne M. Moreau, Wappingers Falls, N.Y.

[73] Assignee: International Business Machines Corporation, Armonk, N.Y.

[21] Appl. No.: 425,531

[22] Filed: Oct. 23, 1989

[51] Int. Cl.$^5$ .................. G03C 1/735; G03F 7/039
[52] U.S. Cl. ................................. 430/270; 430/311; 430/326
[58] Field of Search ............. 430/270, 326, 176, 193, 430/311

[56] References Cited

U.S. PATENT DOCUMENTS

| | | | |
|---|---|---|---|
| 4,404,272 | 9/1983 | Stahlhofen | 430/270 |
| 4,491,628 | 1/1985 | Ito et al. | 430/270 |
| 4,500,628 | 2/1985 | Taylor | 430/311 |
| 4,552,838 | 11/1985 | Ito et al. | 430/270 |
| 4,564,575 | 1/1986 | Perreault et al. | 430/192 |
| 4,681,923 | 7/1987 | Demmer et al. | 430/192 |
| 4,708,925 | 11/1987 | Newman | 430/270 |
| 4,810,601 | 3/1989 | Allen et al. | 430/311 |
| 4,810,613 | 3/1989 | Osuch et al. | 430/192 |
| 4,837,121 | 6/1989 | Blakeney et al. | 430/326 |
| 4,931,379 | 6/1990 | Brunsvold et al. | 430/270 |
| 4,939,070 | 7/1990 | Brunsvold et al. | 430/325 |
| 4,980,264 | 12/1990 | Chiong et al. | 430/192 |

Primary Examiner—Marion E. McCamish
Assistant Examiner—Christopher D. Rodee
Attorney, Agent, or Firm—John A. Stemwedel

[57] ABSTRACT

Highly sensitive, highly absorbing deep ultraviolet and vacuum ultraviolet resists which comprise a novolak resin protected with an acid labile group and a photoinitiator which generates a strong acid upon exposure to deep ultraviolet or vacuum ultraviolet radiation. The exposed resists are reacted with organometallic compounds to form reactive ion etch resistant patterns.

14 Claims, No Drawings

HIGHLY SENSITIVE DRY DEVELOPABLE DEEP UV PHOTORESIST

BACKGROUND OF THE INVENTION

1. Field of the Invention

The present invention relates to photoresists which are highly sensitive to deep ultraviolet and vacuum ultraviolet radiation and which are developable in a dry process. Such compositions are highly absorbing in the deep ultraviolet spectrum and are functionalized so that their reactivity to organometallic reagents in exposed regions and unexposed regions is greatly differentiated.

2. Background Art

U.S. Pat. No. 4,491,628 discloses resist compositions which comprise certain polymers having acid labile groups pendant thereto and a photoinitiator which generates strong acid upon exposure to radiation. The preferred polymers are vinylics having aromatic rings (i.e. styrenes) although other polymerizations such as condensation, polyaddition and addition condensation are also useful. The photoinitiators used included diaryliodonium, triarylsulfonium, triarylselenonium and aryldiazonium salts. The resulting resists form solvent developable systems which are positive working when developed with an (aqueous) alkaline developer or polar solvent and are negative working when developed with a non-polar solvent. The developed, patterned resists formed provide useful structures due to their resistance to plasma and reactive ion etching (RIE).

U.S. Pat. No. 4,552,833 shows the use of resist compositions having a photo labile or acid labile group masking or protecting a functional group and groups on a resist polymer and a species that is capable of generating acid upon exposure to radiation. Films of that composition may be imaged and reacted with an organometallic agent in the exposed regions and then subjected to an oxygen plasma environment to provide high resolution, negative tone relief images.

F. Houlihan, F. Bouchard, J. M. J. Frechet, and C. G. Willson, *Can. J. Chem.*, 63, 153 (1985), discloses that the tert-butyloxycarbonylation of phenols, alcohols, enols, and thiols can be accomplished by reaction of these functionalities with di-tert-butyl dicarbonate under phase transfer conditions. An example of tert-butyloxycarbonylation of novolak is given.

U.S. Pat. No. 4,810,601 shows the use of resist compositions having at least one component which undergoes molecular rearrangement upon irradiation to produce active hydrogens, irradiating the surface layer of films of such materials to form reaction products in the upper portion of such layer, and treating the reaction products with a reactive organometallic reagent to make the upper portion dry etch resistant.

SUMMARY OF THE INVENTION

In accordance with the present invention, improved dry developable photoresist compositions are provided which comprise a phenol-aldehyde type condensation product, the hydroxyl group of which is substituted with an acid labile group which inhibits the reaction of the protected condensation product with organometallic reagents and a photoactive compound which generates a strong acid upon exposure to DUV radiation to remove the acid labile groups from the condensation product in its exposed regions to enable reaction of the de-protected hydroxy groups with the organometallic reagents.

These phenolic compositions are highly absorbing in the deep ultra violet spectrum and the vacuum ultraviolet spectrum (between 100–300 nm) and are functionalized or protected so that there is a great differential between the reactivity of exposed regions and unexposed regions to organometallic reagents. Resists formed with such compositions are particularly useful in top surface imaging processes.

The phenol-aldehyde condensation products are novolaks which are well known and which may be represented by the general formula

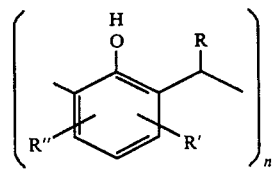

where R is selected from the group consisting of H, —CH$_3$ and phenyl, where R' is selected from the group consisting of H, alkyl and aryl, and where R" is selected from the group consisting of H, halo, nitro, alkoxy, alkyl, aryl, and hydroxyl, and where the base aromatic ring may have fused thereto and additional ring structure to form a naphthol or anthracene unit. Typical of the reactants used in producing the phenolic resins useful in the invention include as the phenol component phenol and alkyl substituted phenols, especially cresols, and higher hydroxy aromatics including naphthols and hydroxy anthracene and phenanthrene and include as the aldehyde component formaldehyde, acetaldehyde and benzaldehyde. The novolaks so formed may be mixtures of such phenolic resins. It is preferred that the predominent component be a cresol novolak, especially m-cresol novolak.

Typically, the base novolak is a phenol formaldehyde condensation product which is then derivatized so that at least about 90% of its hydroxy groups are O-substituted with acid labile functional groups such as esters, ethers, carbamates, and the like. Thus among the more suitable materials are alkoxy ester novolaks where the alkoxy group is selected from the group consisting of tertiary and secondary alkoxy groups, alkyl ether novolaks where the alkyl group is selected from the group consisting of tertiary and secondary alkyl groups, and alkyl carbonate, and reaction products with the novolak hydroxy group.

It is more preferred to have at least 95% of the hydroxy group derivatized in order to maintain precise boundaries between exposed and unexposed regions of the photoresist mode with the protected novolak. The optimum performance is achieved when at least 98% of the hydroxy group are protected.

The hydroxy groups of the novolak have an affinity to react with organometallic reagents. Those having the acid labile substituent groups inhibit the reaction of such groups with organometallic reagents. Upon exposure to deep UV radiation the photoinitiator generates a strong acid which removes the acid labile groups forming secondary or tertiary carbonium ions which has an available alpha-proton to form an olefin and an hydronium ion to continue the acid hydrolysis in the region of exposure. A secondary olefin and carbon dioxide are the usual decomposition products. The preferred substituent groups include t-butyloxycarbonyl, 2-propyloxycarbonyl, t-butyl ether, and t-butylcarbonyl. Secondary carbonium forming protecting groups of the type disclosed in U.S. Ser. No. 267,738, filed Nov. 3, 1988, a file wrapper continuation of Ser. No. 922,657, filed Oct. 24, 1986, the disclosures of which are hereby incorporated by reference into the instant application, are also useful. The materials provide high temperature resistance by the selection of secondary substituent structures which form carbonium ions less stable than the t-butyl ion and which have an available alpha-hydrogen. The most preferred substituent group is t-butyloxycarbonyl which forms a t-butylcarbonate with the preferred m-cresol novolak referred to above.

The radiation sensitive materials are radiation degradable acid generating materials which have sufficient strength to remove the acid labile protecting groups from the exposed sites on the polymer. These materials include metallic and non-metallic onium salts, tosylates and non-metallic sulfonic acid precursors which generate strong acids upon exposure to radiation. Onium salts are a well known class of material and include diaryliodonium salts and arylsulfonium salts. Typical of the diaryliodonium salts is di(tert-butylphenyl)iodonium trifluoromethane sulfonate. Arylsulfonium salts are more commonly used and include triphenylsulfonium hexafluoroantimonate, triphenylsulfonium hexafluoroarsenate. The triarylselenionium analogues of these salts are useful as well. Aryl diazonium salts also provide suitably strong acid to remove the acid bile groups Triphenylsulfonium trifluoromethane sulfonates and benzene sulfonates are advantageous as well. The benzene sulfonates may be ring substituted with halogen (F, Cl, Br), nitro, cyano, trifluoromethyl or methyl. The p-toluene sulfonates being especially useful. Non-metallic sulfonic acid precursors of the type disclosed in U.S. patent application Ser. No. 322,848, filed Mar. 14, 1989, the disclosure of which is incorporated by reference into the instant application discloses the use of N-sulfonyloxyimides of the form

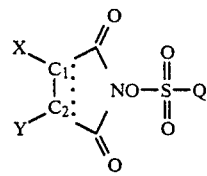

wherein Q is selected from the group consisting of $-CF_3$, $-CF_2CF_3$, $-CF_2CF_2H$, $-(CF_2)_n-Z$ where $n=1$ to 4, where Z is H, alkyl, aryl,

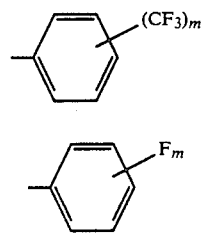

where $m=1$ to 5, where X and Y (1) form a cyclic or polycyclic ring which may contain one or more hetero atoms, (2) form a fused aromatic ring, (3) may be independently H, alkyl or aryl, (4) may be attached to another sulfonyloxyimide-containing residue, or (5) may be attached to a polymeric chain or backbone.

The compositions of the invention are particularly useful in patterning over uneven or highly reflective substrates because of the high opacity of the films (1.0/$\mu$m) to imaging deep UV and vacuum UV radiation. Thus only the top layer or region exposed will be deprotected. However, such deprotected region is of an effective depth to enable reaction with organometallic compounds to a sufficient degree to form a reactive ion etch barrier for further processing.

The compositions of the invention are formulated with appropriate solvents for applying the compositions to substrates, and the like. Typically 15–40% solids will be carried in a volatile solvent such as propylene glycol alkyl ether acetate. The use of solvents with photo resists is a well developed area and it is well known to use xylene, alkyl esters, including alkyl acetates, especially n-butyl acetate, ethyl lactate, and propylene glycol alkyl ether acetates, and admixtures. In this regard we have found propylene glycol methyl ether acetate to be a most preferred solvent.

The protected phenol-aldehyde condensation product is present in a preferred embodiment in an amount from about 15 to 40% by weight of the composition. The photoinitiator in that embodiment is present in an amount from 1 to 40% by weight of the protected phenol-aldehyde condensation product.

EXAMPLE 1-SYNTHESIS

A substituted novolak resin composition was prepared from a m-cresol novolak resin where the hydroxyl group was replaced with a tertiary butyl group as follows. The synthesis was carried out by dissolving 1.00 mole equivalents of a m-cresol novolak resin in tetrahydofuran and by adding 1.05 mole equivalents of triethylamine, 0.05 mole equivalents of dimethylaminopyridine, and 1.5 mole equivalents of di-tert-butyl pyrocarbonate at about 25° C. The reaction mixture was refluxed for 14–18 hours. This method is a modification of the method set forth in Can. J. Chem., 63, 153 (1985). After the reaction was completed, the reaction solvent was evaporated and the liquid polymer "dope" was precipitated by dropwise addition to hexane. The polymer was collected by filtration and dried in a vacuum oven for 14–18 hours. IR analysis indicated that 98–99% of the hydroxyl moieties were converted to carbonate moieties.

EXAMPLE 2-FORMULATION

A resist composition was prepared comprising 25% by weight of the substituted novolak resin composition of Example 1 and 10% by weight of the substituted novolak resin composition of triphenylsulfoniumhexafluoroantimonate in a propylene glycol methyl ether acetate solvent. This resist solution was applied to silicon wafers by spin coating at 2500 rpm for 30 seconds. The coated wafers were placed in a prebake oven for 20 minutes at 85° C. to remove residual solvent remaining in the film.

EXAMPLE 3-LITHOGRAPHY-TOP SURFACE IMAGERY

Resist coated silicon wafers prepared in accordance with Example 2 were subjected to patternwise exposure of about 8 mJ/cm² of UV radiation on a Perkin Elmer 500 in UV2 (from about 210–290 nm). Due to the high optical density of the functionalized novolak, only the acid labile groups in the top surface of the film were removed and provide sites displaying an affinity for reaction with organometallic reagents. The wafers were then subjected to a mild flood exposure to remove the acid labile groups at the film surface. The exposed wafers were then subjected to a post-exposure bake at about 90° C. for about 75 seconds to cleave the carbonate sidechains in the exposed regions leaving deprotected hydroxyl groups in the exposed regions of the resin film. The wafers with such deprotected regions were introduced into a vacuum chamber and were subjected to vapor silylation using N,N-diethylamino-trimethyl silane at 115° C. under vacuum for 10 minutes. Thereafter, the wafers were subjected to a postsilylation bake at 130° C. for 30 minutes to drive the silylation reaction to completion. The silylated wafers were placed in a reactive ion etch chamber and were oxygen etch developed with 47 sccm oxygen flow at 40 mm (40 t) pressure and 100 watts of power. The developed wafers were dipped in a 10:1 solution of buffered HF for about 10 seconds and were rinsed with deionized water. The resultant film was about 1.0 μm thick and was developed in a negative tone with 1.0 μm line and space features.

EXAMPLE 4-LITHOGRAPHY-MODIFIED IMAGE REVERSAL

In a process to produce positive tone images, the coated silicon wafers of Example 2 were subjected to patternwise exposure at 500 mJ/cm² followed by a post exposure bake to crosslink the exposed regions of the film and to inhibit silylation. The hydroxy groups in the exposed regions were essentially degraded. The wafers were then subjected to a mild flood exposure to remove the acid labile groups at the film surface. A deprotection bake was performed on a hotplate at about 130° C. for about 30 minutes to cleave the t-butylcarbonate groups from the flood exposed regions of the film surface to enable silylation to occur in such regions. Thereafter, the wafers were subjected to a postsilylaton bake at 130° C. for 30 minutes to drive the silylation reaction to completion. The silylated wafers were placed in a reactive ion etch chamber and were oxygen etch developed with 47 sccm oxygen flow at 40 mm (40 t) pressure and 100 watts of power. The developed wafers were dipped in a 10:1 solution of buffered HF for about 10 seconds and were rinsed with deionized water. The resultant film was about 1.0 μm thick and was developed in a positive tone with 1.0 μm line and space features.

We claim:

1. A dry developable photoresist composition which comprises a phenol-aldehyde type condensation product, wherein at least 90% of the hydroxyl groups of which are substituted with acid labile groups which inhibit the reaction of the protected reaction product with organometallic reagents and a photoactive compound which generates a strong acid upon exposure to deep UV radiation or vacuum UV radiation to remove the acid labile groups from the condensation product in its exposed regions to enable reaction of the deprotected hydroxy groups with the organometallic reagents.

2. The photoresist composition of claim 1 wherein the phenol aldehyde type condensation product may be represented by the general formula

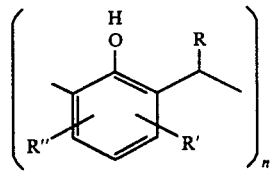

where R is selected from the group consisting of H, —CH₃ and phenyl R' is selected from the group consisting of H, alkyl and aryl, and R" is selected from the group consisting of H, halo, nitro, alkoxy, alkyl, aryl, and hydroxyl, and where the aromatic ring may have fused thereto an additional ring structure to form a napthhol or anthracene unit.

3. The photoresist composition of claim 2 wherein the phenol aldehyde type condensation product is selected from the group consisting of meta-cresol novolak and naphthol novolak.

4. The photoresist composition of claim 1 wherein the acid labile protecting group forms a secondary or tertiary carbonium ion upon reaction with acid having an available alpha proton and is degradable to form an olefin and an hydronium ion to continue the acid hydrolysis in the region of exposure.

5. The photoresist composition of claim 1 wherein the photoactive compound is selected from the group consisting of metallic and nonmetallic onium salts, tosylates and non-metallic sulfonic acid precursors which generate strong acids upon exposure to radiation.

6. The photoresist composition of claim 5 wherein the metallic onium salt is selected from the group consisting of diaryliodonium salts, arylsulfonium salts, and arylselenonium salts.

7. The photoresist composition of claim 1 wherein at least 95% of the hydroxyl groups are substituted with said acid labile groups.

8. The photoresist composition of claim 1 wherein at least 98% of the hydroxyl groups are substituted with said acid liabile groups.

9. The photoresist composition of claim 1 which is dissolved in a solvent selected from the group consisting of xylene, alphyl acetate, propylene glycol alkyl ether acetate, and ethyl lactate, and mixtures thereof.

10. The photoresist composition of claim 9 wherein the solvent is propylene glycol methyl ether acetate.

11. The photoresist composition of claim 9 wherein the protected phenol-aldehyde condensation product is present in an amount from 15–40% by weight of the composition, and the photoactive compound is present in an amount from 1 to 40% by weight of the protected phenol-aldehyde condensation product.

12. The photoresist composition of claim 1 wherein the protected phenol-aldehyde condensation product is a t-butylcarbonate of a m-cresol novolak resin.

13. A dry developable photoresist composition which comprises a phenol-aldehyde type condensation product, wherein at least 90% of the hydroxyl groups of which are substituted with acid labile groups selected from the group consisting of t-butyloxycarbonyl, 2-propyloxycarbonyl, t-butyl ether, and t-butylcarbonyl which inhibit the reaction of the protected reaction product with organometallic reagents which upon reaction with acid forms a secondary or tertiary carbonium ion having an available alpha proton and which is degradable to form an olefin and an hydronium ion to continue acid hydrolysis in exposed regions and a photoactive compound which generates a strong acid upon exposure to deep UV radiation or vacuum UV radiation to remove the acid labile groups from the condensation product in its exposed regions to enable reaction of the de-protected hydroxy groups with the organometalic reagents.

14. A dry developable photoresist composition which comprises a phenol-aldehyde type condensation product, wherein at least 90% of the hydroxyl groups of which are substituted with acid labile groups which inhibit the reaction of the protected reaction product with organometallic reagents and a photoactive compound which comprises a non-metallic sulfonic acid precursor of the form

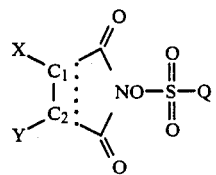

wherein Q is selected from the group consisting of $-CF_3$, $-CF_2CF_3$, $-CF_2CF_2H$, $-(CF_2)_n-Z$ where $n=1$ to 4 and Z is H, alkyl, aryl,

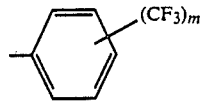

or

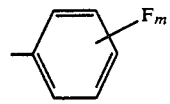

where $m=1$ to 5, where X and Y (1) form a cylcic or polycyclic ring which may contain one or more heteroatoms, (2) form a fused aromatic ring, (3) may be independently H, alkyl or aryl, (4) may be attached to another sulfonyloxyimido-containing residue, or (5) may be attached to a polymeric chain or backbone said photoactive compound generates a strong acid upon exposure to deep UV radiation or vacuum UV radiation to remove the acid labile groups from the condensation product in its exposed regions to enable reaction of the de-protected hydroxy groups with the organometallic reagents.

* * * * *